(12) United States Patent
Benvegnu et al.

(10) Patent No.: US 8,352,061 B2
(45) Date of Patent: Jan. 8, 2013

(54) SEMI-QUANTITATIVE THICKNESS DETERMINATION

(75) Inventors: Dominic J. Benvegnu, La Honda, CA (US); Boguslaw A. Swedek, Cupertino, CA (US); Jeffrey Drue David, San Jose, CA (US); Harry Q. Lee, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 716 days.

(21) Appl. No.: 12/271,674

(22) Filed: Nov. 14, 2008

(65) Prior Publication Data
US 2010/0124870 A1   May 20, 2010

(51) Int. Cl.
*G06F 19/00* (2011.01)
(52) U.S. Cl. ......................................... 700/121; 700/164
(58) Field of Classification Search .................. 700/121, 700/164
See application file for complete search history.

(56) References Cited

U.S. PATENT DOCUMENTS

| | | | |
|---|---|---|---|
| 5,365,340 A | 11/1994 | Ledger | |
| 5,595,526 A | 1/1997 | Yau et al. | |
| 5,747,380 A | 5/1998 | Yu et al. | |
| 5,893,796 A | 4/1999 | Birang et al. | |
| 6,153,116 A | 11/2000 | Yang et al. | |
| 6,172,756 B1 | 1/2001 | Chalmers et al. | |
| 6,184,985 B1 | 2/2001 | Chalmers et al. | |
| 6,190,234 B1 | 2/2001 | Swedek et al. | |
| 6,204,922 B1 | 3/2001 | Chalmers | |
| 6,271,047 B1 | 8/2001 | Ushio et al. | |
| 6,296,548 B1 | 10/2001 | Wiswesser et al. | |
| 6,358,327 B1 | 3/2002 | Pokhama et al. | |
| 6,361,646 B1 | 3/2002 | Bibby, Jr. et al. | |
| 6,489,624 B1 | 12/2002 | Ushio et al. | |
| 6,511,363 B2 | 1/2003 | Yamane et al. | |
| 6,618,130 B2 | 9/2003 | Chen | |
| 6,623,991 B2 | 9/2003 | Johnson et al. | |
| 6,645,045 B2 * | 11/2003 | Ohkawa | 451/6 |
| 6,664,557 B1 | 12/2003 | Amartur | |
| 6,670,200 B2 | 12/2003 | Ushio et al. | |
| 6,676,482 B2 | 1/2004 | Bibby, Jr. et al. | |
| 6,678,046 B2 | 1/2004 | Opsal | |

(Continued)

FOREIGN PATENT DOCUMENTS
CN   1458673   11/2003
(Continued)

OTHER PUBLICATIONS

Kim, Jun Hak, Korean Authorized Officer, International Search Report and the Written Opinion in PCT/US2009/063913 mailed May 27, 2010, 10 pages.

*Primary Examiner* — Carlos Ortiz Rodriguez
(74) *Attorney, Agent, or Firm* — Fish & Richardson P.C.

(57) ABSTRACT

While a substrate is polished, it is also irradiated with light from a light source. A current spectrum of the light reflected from the surface of the substrate is measured. A selected peak, having a first parameter value, is identified in the current spectrum. A value of a second parameter associated with the first parameter is determined from a lookup table using a processor. Depending on the value of the second parameter, the polishing of the substrate is changed. An initial spectrum of light reflected from the substrate before the polishing of the substrate can be measured and a wavelength corresponding to a selected peak of the initial spectrum can be determined.

21 Claims, 14 Drawing Sheets

U.S. PATENT DOCUMENTS

| | | | |
|---|---|---|---|
| 6,678,055 B2 | 1/2004 | Du-Nour et al. |
| 6,762,838 B2 | 7/2004 | Du-Nour |
| 6,768,967 B2 | 7/2004 | Johnson et al. |
| 6,801,321 B1 | 10/2004 | Du-Nour |
| 6,806,105 B2 | 10/2004 | Johnson et al. |
| 6,806,948 B2 | 10/2004 | Katz et al. |
| 6,813,034 B2 | 11/2004 | Rosencwaig et al. |
| 6,819,426 B2 | 11/2004 | Sezginer et al. |
| 6,836,328 B2 | 12/2004 | Opsal |
| 6,842,259 B2 | 1/2005 | Rosencwaig et al. |
| 6,885,467 B2 | 4/2005 | DuNour et al. |
| 6,898,596 B2 | 5/2005 | Aikens et al. |
| 6,908,374 B2 | 6/2005 | Wang et al. |
| 6,947,135 B2 | 9/2005 | Johnson |
| 6,995,842 B2 | 2/2006 | Opsal |
| 7,018,271 B2 | 3/2006 | Wiswesser et al. |
| 7,042,581 B2 * | 5/2006 | Schietinger et al. .......... 356/630 |
| 7,097,537 B1 | 8/2006 | David et al. |
| 7,255,771 B2 | 8/2007 | Chen et al. |
| 7,409,260 B2 | 8/2008 | David et al. |
| 2001/0039064 A1 | 11/2001 | Ushio et al. |
| 2002/0013007 A1 | 1/2002 | Hasegawa et al. |
| 2002/0030826 A1 | 3/2002 | Chalmers et al. |
| 2002/0127951 A1 | 9/2002 | Ishikawa et al. |
| 2002/0155789 A1 | 10/2002 | Bibby, Jr. et al. |
| 2002/0173225 A1 | 11/2002 | Wang et al. |
| 2003/0002032 A1 | 1/2003 | DuNour |
| 2003/0022400 A1 | 1/2003 | Nomoto et al. |
| 2003/0053042 A1 | 3/2003 | Chen |
| 2003/0098704 A1 | 5/2003 | DuNour et al. |
| 2003/0153246 A1 | 8/2003 | Desai et al. |
| 2003/0184732 A1 | 10/2003 | Katz et al. |
| 2003/0205664 A1 | 11/2003 | Abe et al. |
| 2004/0080761 A1 | 4/2004 | Du-Nour et al. |
| 2004/0242121 A1 | 12/2004 | Hirokawa |
| 2005/0026542 A1 | 2/2005 | Battal et al. |
| 2005/0117164 A1 | 6/2005 | Nomoto et al. |
| 2006/0020419 A1 | 1/2006 | Benvegnu |
| 2006/0274326 A1 | 12/2006 | Kobayashi et al. |
| 2007/0039925 A1 | 2/2007 | Swedek et al. |
| 2007/0042675 A1 | 2/2007 | Benvegnu et al. |
| 2008/0099443 A1 | 5/2008 | Benvegnu et al. |

FOREIGN PATENT DOCUMENTS

| | | |
|---|---|---|
| CN | 1196182 C | 4/2005 |
| EP | 1176631 | 1/2002 |
| JP | 2000-183001 | 6/2000 |
| JP | 2000-310512 | 11/2000 |
| JP | 2001-105308 | 4/2001 |
| JP | 2001-287159 | 10/2001 |
| JP | 2002-009030 | 1/2002 |
| JP | 2002-359217 | 12/2002 |
| JP | 2004-165473 | 10/2004 |
| JP | 2005-159203 | 6/2005 |
| TW | 541233 | 7/2003 |
| WO | WO 00/54935 | 9/2000 |
| WO | WO 01/72470 | 10/2001 |
| WO | WO 2004/035265 | 4/2004 |

* cited by examiner

| Thickness of Active Oxide (Å) | Amount Removed (Å) | Change in Peak Location [Rel. to 1st Spectrum] (Å) |
|---|---|---|
| 3000.00 | 0.00 | 0.00 |
| 2980.00 | 20.00 | -19.30 |
| 2960.00 | 40.00 | -34.70 |
| 2940.00 | 60.00 | -53.70 |
| 2920.00 | 80.00 | -68.90 |
| 2900.00 | 100.00 | -83.90 |
| 2880.00 | 120.00 | -98.90 |
| 2860.00 | 140.00 | -114.00 |
| 2840.00 | 160.00 | -132.00 |
| 2820.00 | 180.00 | -154.00 |
| 2800.00 | 200.00 | -169.00 |
| 2780.00 | 220.00 | -183.00 |
| 2760.00 | 240.00 | -198.00 |
| 2740.00 | 260.00 | -212.00 |
| 2720.00 | 280.00 | -230.00 |
| 2700.00 | 300.00 | -247.00 |
| 2680.00 | 320.00 | -265.00 |
| 2660.00 | 340.00 | -282.00 |
| 2640.00 | 360.00 | -296.00 |
| 2620.00 | 380.00 | -316.00 |
| 2600.00 | 400.00 | -337.00 |
| 2580.00 | 420.00 | -353.00 |
| 2560.00 | 440.00 | -370.00 |
| 2540.00 | 460.00 | -383.00 |
| 2520.00 | 480.00 | -403.00 |
| 2500.00 | 500.00 | -419.00 |
| 2480.00 | 520.00 | -436.00 |
| 2460.00 | 540.00 | -452.00 |
| 2440.00 | 560.00 | -468.00 |
| 2420.00 | 580.00 | -487.00 |
| 2400.00 | 600.00 | -502.00 |
| 2380.00 | 620.00 | -518.00 |

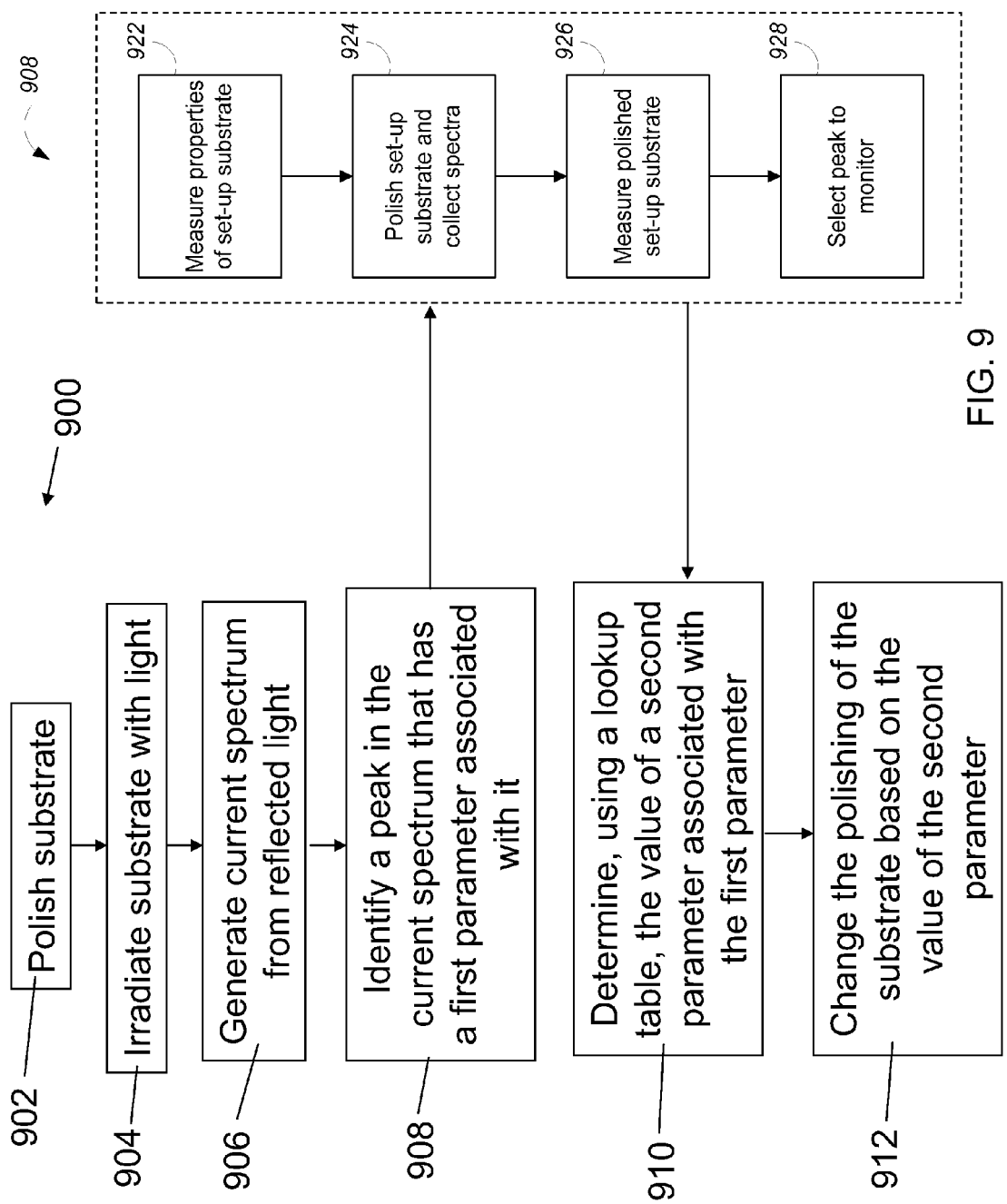

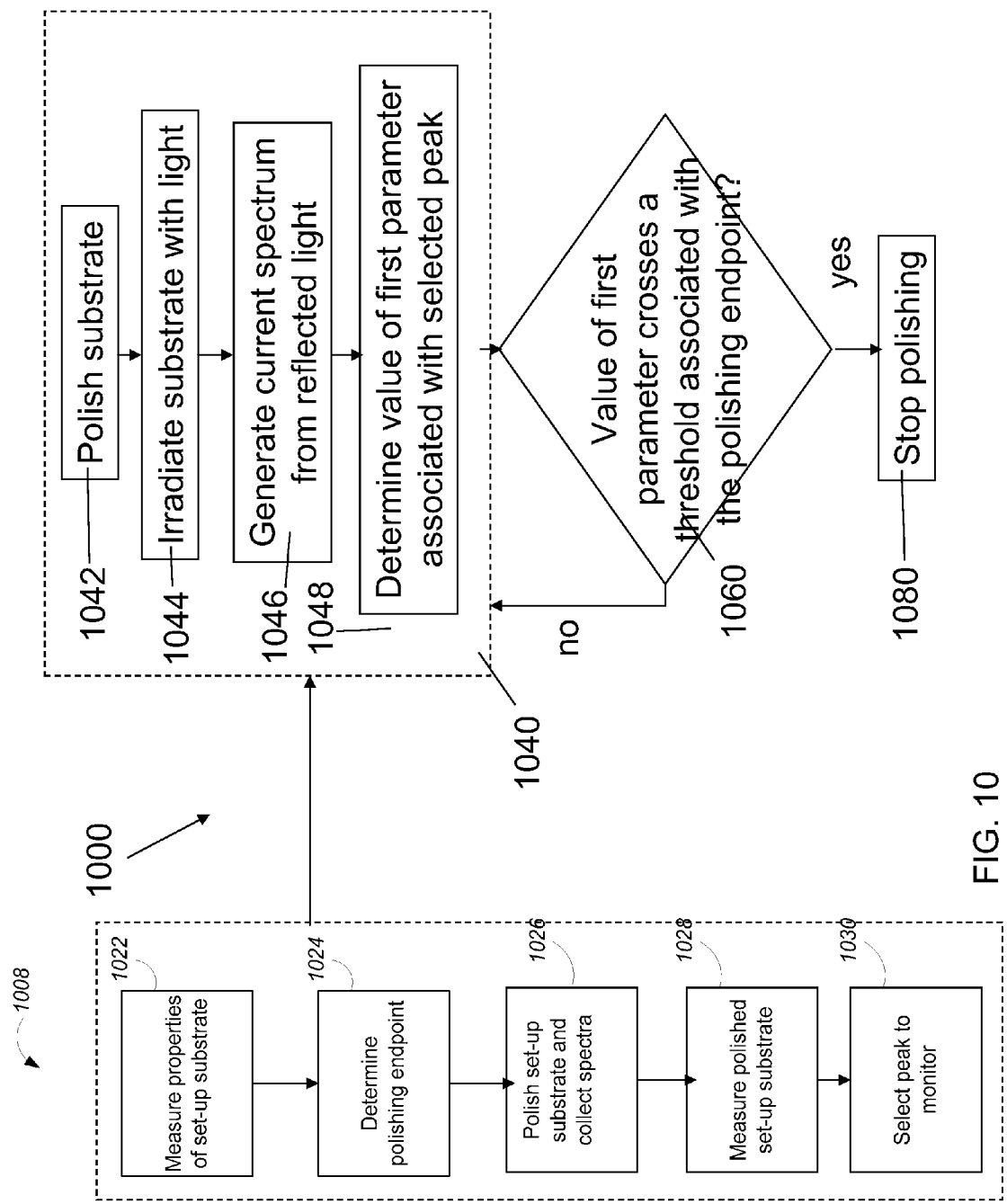

SEMI-QUANTITATIVE THICKNESS DETERMINATION

BACKGROUND

The present invention relates to generally to chemical mechanical polishing of substrates.

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually desired for photolithography.

Chemical mechanical polishing (CMP) is one accepted method of planarization. This planarization method typically requires that the substrate be mounted on a carrier or polishing head. The exposed surface of the substrate is typically placed against a rotating polishing disk pad or belt pad. The polishing pad can be either a standard pad or a fixed abrasive pad. A standard pad has a durable roughened surface, whereas a fixed-abrasive pad has abrasive particles held in a containment media. The carrier head provides a controllable load on the substrate to push it against the polishing pad. A polishing slurry is typically supplied to the surface of the polishing pad. The polishing slurry includes at least one chemically reactive agent and, if used with a standard polishing pad, abrasive particles.

One problem in CMP is determining whether the polishing process is complete, i.e., whether a substrate layer has been planarized to a desired flatness or thickness, or when a desired amount of material has been removed. Overpolishing (removing too much) of a conductive layer or film leads to increased circuit resistance. On the other hand, underpolishing (removing too little) of a conductive layer leads to electrical shorting. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, the polishing endpoint cannot be determined merely as a function of polishing time.

SUMMARY

While a substrate is polished, it is also irradiated with light from a light source. A current spectrum of the light reflected from the surface of the substrate is measured.

In one embodiment, a selected peak, having a first parameter value, is identified in the current spectrum. A value of a second parameter associated with the first parameter is determined from a lookup table using a processor. Depending on the value of the second parameter, the polishing of the substrate is changed. An initial spectrum of light reflected from the substrate before the polishing of the substrate can be measured and a wavelength corresponding to a selected peak of the initial spectrum can be determined.

In another embodiment, a polishing endpoint is determined, using a processor, from a lookup table, wherein the lookup table includes values for a first parameter and a second parameter, and the polishing endpoint is determined by defining a target value of the second parameter and determining a value of the first parameter associated with the target value of the second parameter. The substrate is polished and the substrate is irradiated with a second beam of light. A current spectrum of the second beam of light reflected from the surface of the substrate while the substrate is being polished is measured. A selected peak in the current spectrum and a wavelength corresponding to the selected peak is identified. A value of the first parameter associated with the selected peak is determined. If the value of the first parameter associated with the selected peak is within a predetermined range of the value of the first parameter associated with the target value of the second parameter, the polishing is ceased.

Polishing a substrate can comprise removing a quantity of a planarizing substance from a surface of the substrate, and the second parameter is a thickness of the planarizing substance.

The first parameter can be a wavelength shift relative to the wavelength corresponding to the selected peak of the initial spectrum. The first parameter can further be a change of width of the selected peak with respect to the width of the selected peak of the initial spectrum.

A process associated with the polishing can be a shallow trench isolation process. A process associated with the polishing can further be a interlayer dielectric process.

The various aspects of the invention may be embodied in processes performed by data processing equipment, as a tangible computer readable medium encoded with computer program instructions that instruct a computer to perform such a process, or as data processing equipment that performs such a process.

DESCRIPTION OF DRAWINGS

FIG. 8 shows a lookup table.

FIG. 9 shows a flow chart illustrating the use of a lookup table in changing a polishing of a substrate by using a value of a second parameter associated with a selected peak.

FIG. 10 shows a flow chart illustrating the use of a lookup table in endpoint determination.

Like reference symbols in the various drawings indicate like elements.

DETAILED DESCRIPTION

Figure 1:
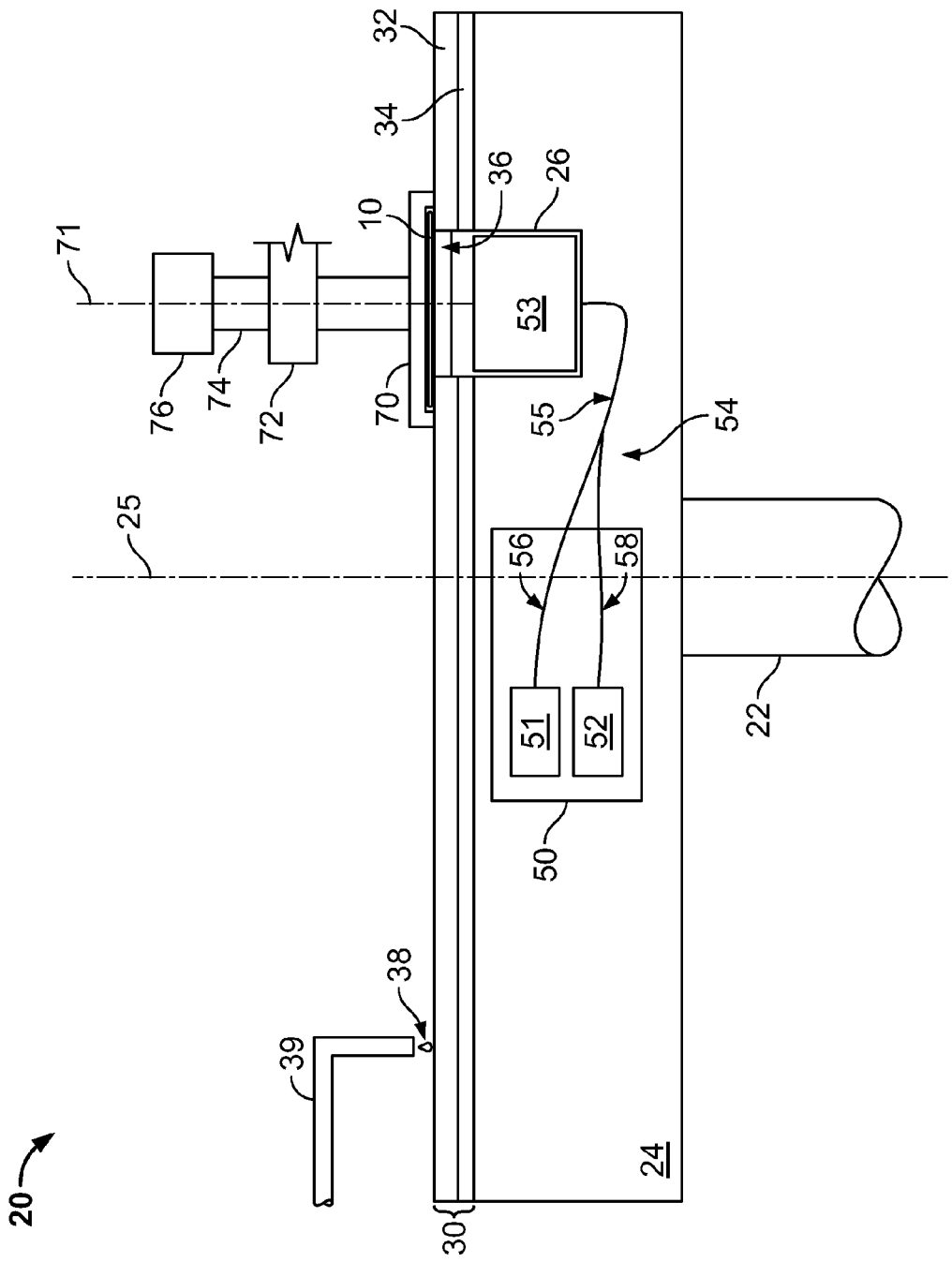
FIG. 1 shows a chemical mechanical polishing apparatus.

FIG. 1 shows a polishing apparatus 20 operable to polish a substrate 10. The polishing apparatus 20 includes a rotatable disk-shaped platen 24, on which a polishing pad 30 is situated. The platen is operable to rotate about axis 25. For example, a motor can turn a drive shaft 22 to rotate the platen 24. The polishing pad 30 can be detachably secured to the platen 24, for example, by a layer of adhesive. When worn, the polishing pad 30 can be detached and replaced. The polishing pad 30 can be a two-layer polishing pad with an outer polishing layer 32 and a softer backing layer 34.

Optical access 36 through the polishing pad is provided by including an aperture (i.e., a hole that runs through the pad) or a solid window. The solid window can be secured to the polishing pad, although in some implementations the solid window can be supported on the platen 24 and project into an aperture in the polishing pad. The polishing pad 30 is usually placed on the platen 24 so that the aperture or window overlies an optical head 53 situated in a recess 26 of the platen 24. The optical head 53 consequently has optical access through the aperture or window to a substrate being polished. The optical head is further described below.

The window can be, for example, a rigid crystalline or glassy material, e.g., quartz or glass, or a softer plastic material, e.g., silicone, polyurethane or a halogenated polymer (e.g., a fluoropolymer), or a combination of the materials mentioned. The window can be transparent to white light. If a top surface of the solid window is a rigid crystalline or glassy material, then the top surface should be sufficiently recessed from the polishing surface to prevent scratching. If the top surface is near and may come into contact with the polishing surface, then the top surface of the window should be a softer plastic material. In some implementations the solid window is secured in the polishing pad and is a polyurethane window, or a window having a combination of quartz and polyurethane. The window can have high transmittance, for example, approximately 80% transmittance, for monochromatic light of a particular color, for example, blue light or red light. The window can be sealed to the polishing pad 30 so that liquid does not leak through an interface of the window and the polishing pad 30.

In one implementation, the window includes a rigid crystalline or glassy material covered with an outer layer of a softer plastic material. The top surface of the softer material can be coplanar with the polishing surface. The bottom surface of the rigid material can be coplanar with or recessed relative to the bottom surface of the polishing pad. In particular, if the polishing pad includes two layers, the solid window can be integrated into the polishing layer, and the bottom layer can have an aperture aligned with the solid window.

Assuming that the window includes a combination of a rigid crystalline or glassy material and a softer plastic material, no adhesive need be used to secure the two portions. For example, in one implementation, no adhesive is used to couple the polyurethane portion to the quartz portion of the window. Alternatively, an adhesive that is transparent to white light can be used or an adhesive can be applied so that light passing through the window does not pass through the adhesive. By way of example, the adhesive can be applied only to the perimeter of the interface between the polyurethane and quartz portion. A refractive index gel can be applied to a bottom surface of the window.

A bottom surface of the window can optionally include one or more recesses. A recess can be shaped to accommodate, for example, an end of an optical fiber cable or an end of an eddy current sensor. The recess allows the end of the optical fiber cable or the end of the eddy current sensor to be situated at a distance, from a substrate surface being polished, that is less than a thickness of the window. With an implementation in which the window includes a rigid crystalline portion or glass like portion and the recess is formed in such a portion by machining, the recess is polished so as to remove scratches caused by the machining. Alternatively, a solvent and/or a liquid polymer can be applied to the surfaces of the recess to remove scratches caused by machining. The removal of scratches usually caused by machining reduces scattering and can improve the transmittance of light through the window.

Figure 2A:
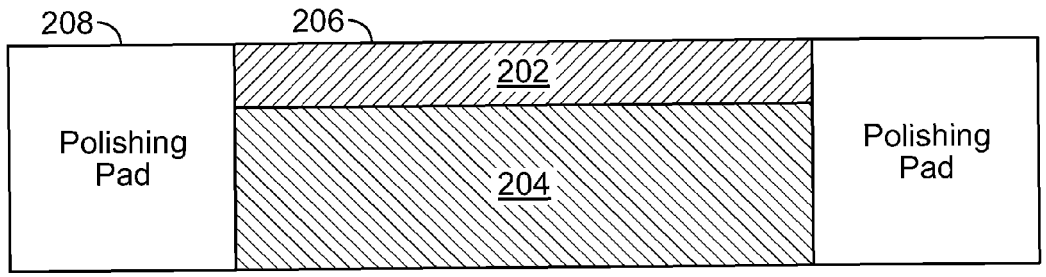
FIGS. 2A-2H show implementations of a polishing pad window.

FIG. 2A-2H show various implementations of the window. As shown in FIG. 2A, the window can have two portions, a polyurethane portion 202 and a quartz portion 204. The portions are layers, with the polyurethane portion 202 situated on top of the quartz portion 204. The window can be situated in the polishing pad so that the top surface 206 of the polyurethane layer is coplanar with a polishing surface 208 of the polishing pad.

Figure 2B:
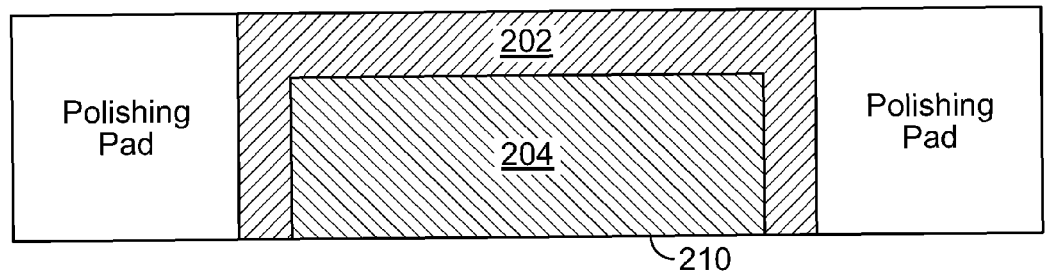

As shown in FIG. 2B, the polyurethane portion 202 can have a recess in which the quartz portion is situated. A bottom surface 210 of the quartz portion is exposed.

Figure 2C:
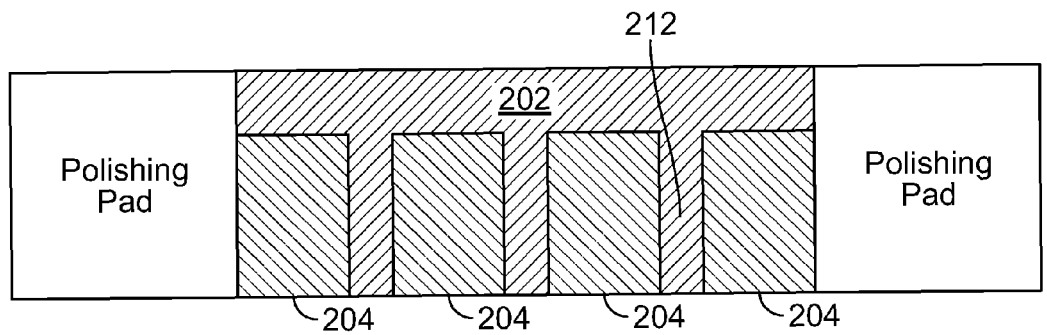

As shown in FIG. 2C, the polyurethane portion 202 can include projections, for example, projection 212, that project into the quartz portion 204. The projections can act to reduce the likelihood that the polyurethane portion 202 will be pulled away from the quartz portion 204 due to friction from the substrate or retaining ring.

Figure 2D:
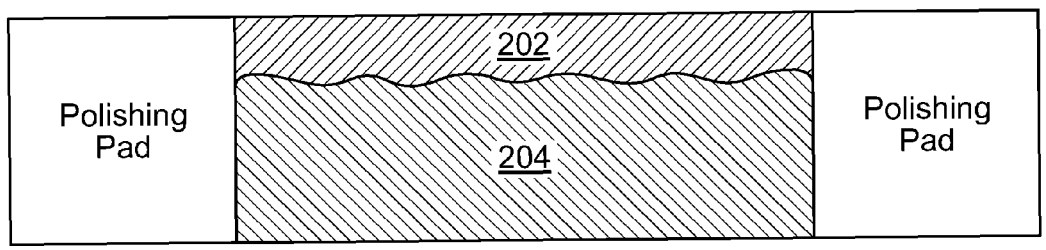

As shown in FIG. 2D, the interface between the polyurethane portion 202 and quartz portion 204 can be a rough surface. Such a surface can improve the strength of the coupling of the two portions of the window, also reducing the likelihood the polyurethane portion 202 will be pulled away from the quartz portion 204 due to friction from the substrate or retaining ring.

Figure 2E:
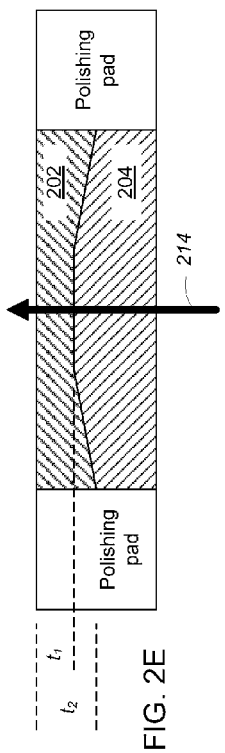

As shown in FIG. 2E, the polyurethane portion 202 can have non-uniform thickness. The thickness at a location that would be in the path 214 of a light beam is less than the thickness at a location that would not be in the path 214 of the light beam. By way of example, thickness $t_1$ is less than thickness $t_2$. Alternatively, the thickness can be less at the edges of the window.

Figure 2F:
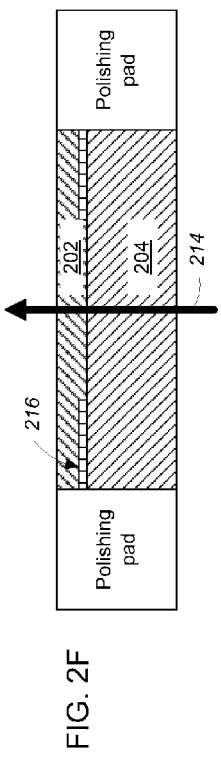

As shown in FIG. 2F, the polyurethane portion 202 can be attached to the quartz portion 204 by use of an adhesive 216. The adhesive can be applied so that it would not be in the path 214 of the light beam.

Figure 2G:
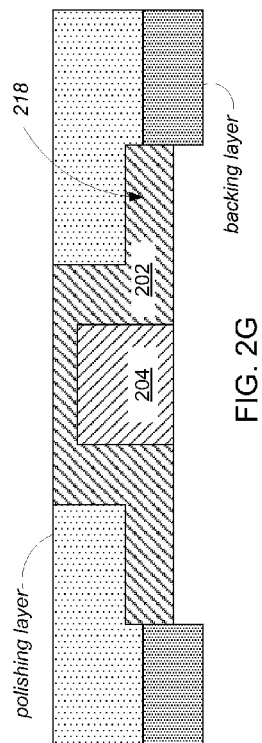

As shown in FIG. 2G, the polishing pad can include a polishing layer and a backing layer. The polyurethane portion 202 extends through the polishing layer and at least partially into the backing layer. The hole in the backing layer can be larger in size than the hole in the polishing layer, and the section of the polyurethane in the backing layer can be wider than the section of the polyurethane in the polishing layer. The polishing layer thus provides a lip 218 which overhangs the window and which can act to resist a pulling of the polyurethane portion 202 away from the quartz portion 204. The polyurethane portion 202 conforms to the holes of the layers of the polishing pad.

Figure 2H:
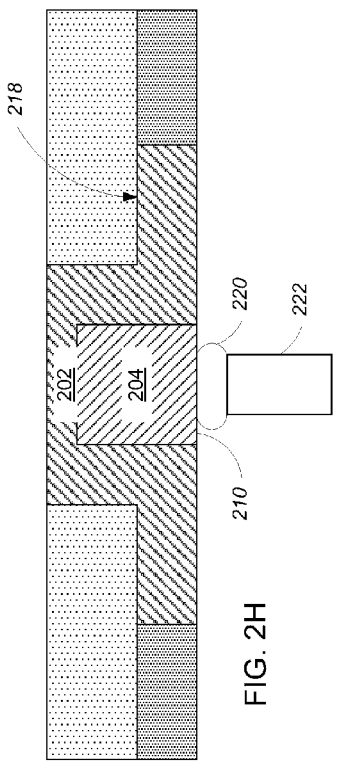

As shown in FIG. 2H, refractive index gel 220 can be applied to the bottom surface 210 of the quartz portion 204 so as to provide a medium for light to travel from a fiber cable 222 to the window. The refractive index gel 220 can fill the volume between the fiber cable 222 and the quartz portion 204 and can have a refractive index that matches or is between the indices of refraction of the fiber cable 222 and the quartz portion 204.

In implementations where the window includes both quartz and polyurethane portions, the polyurethane portion should have a thickness so that, during the life time of the polishing pad, the polyurethane portion will not be worn so as to expose the quartz portion. The quartz can be recessed from the bottom surface of the polishing pad, and the fiber cable 222 can extend partially into the polishing pad.

The above described window and polishing pad can be manufactured using a variety of techniques. The polishing pad's backing layer 34 can be attached to its outer polishing layer 32, for example, by adhesive. The aperture that provides optical access 36 can be formed in the pad 30, e.g., by cutting or by molding the pad 30 to include the aperture, and the window can be inserted into the aperture and secured to the pad 30, e.g., by an adhesive. Alternatively, a liquid precursor of the window can be dispensed into the aperture in the pad 30 and cured to form the window. Alternatively, a solid transparent element, e.g., the above described crystalline or glass like portion, can be positioned in liquid pad material, and the liquid pad material can be cured to form the pad 30 around the transparent element. In either of the later two cases, a block of pad material can be formed, and a layer of polishing pad with the molded window can be scythed from the block.

With an implementation in which the window includes a crystalline or glass-like first portion and a second portion made of soft plastic material, the second portion can be formed in the aperture of the pad 30 by applying the described liquid precursor technique. The first portion can then be inserted. If the first portion is inserted before the liquid precursor of the second portion is cured, then curing can bond the first and second portions. If the first portion is inserted after the liquid precursor is cured, then the first and second potions can be secured by using an adhesive.

The polishing apparatus 20 can include a flushing system to improve light transmission through the optical access 36. There are different implementations of the flushing system. With implementations of the polishing apparatus 20 in which the polishing pad 30 includes an aperture instead of a solid window, the flushing system is implemented to provide a laminar flow of a fluid, e.g., a gas or liquid, across a top surface of the optical head 53. (The top surface can be a top surface of a lens included in the optical head 53.) The laminar flow of fluid across the top surface of the optical head 53 can sweep opaque slurry out of the optical access and/or prevent slurry from drying on the top surface and, consequently, improves transmission through the optical access. With implementations in which the polishing pad 30 includes a solid window instead of an aperture, the flushing system is implemented to direct a flow of gas at a bottom surface of the window. The flow of gas can prevent condensation from forming at the solid window's bottom surface which would otherwise impede optical access.

Figure 3:
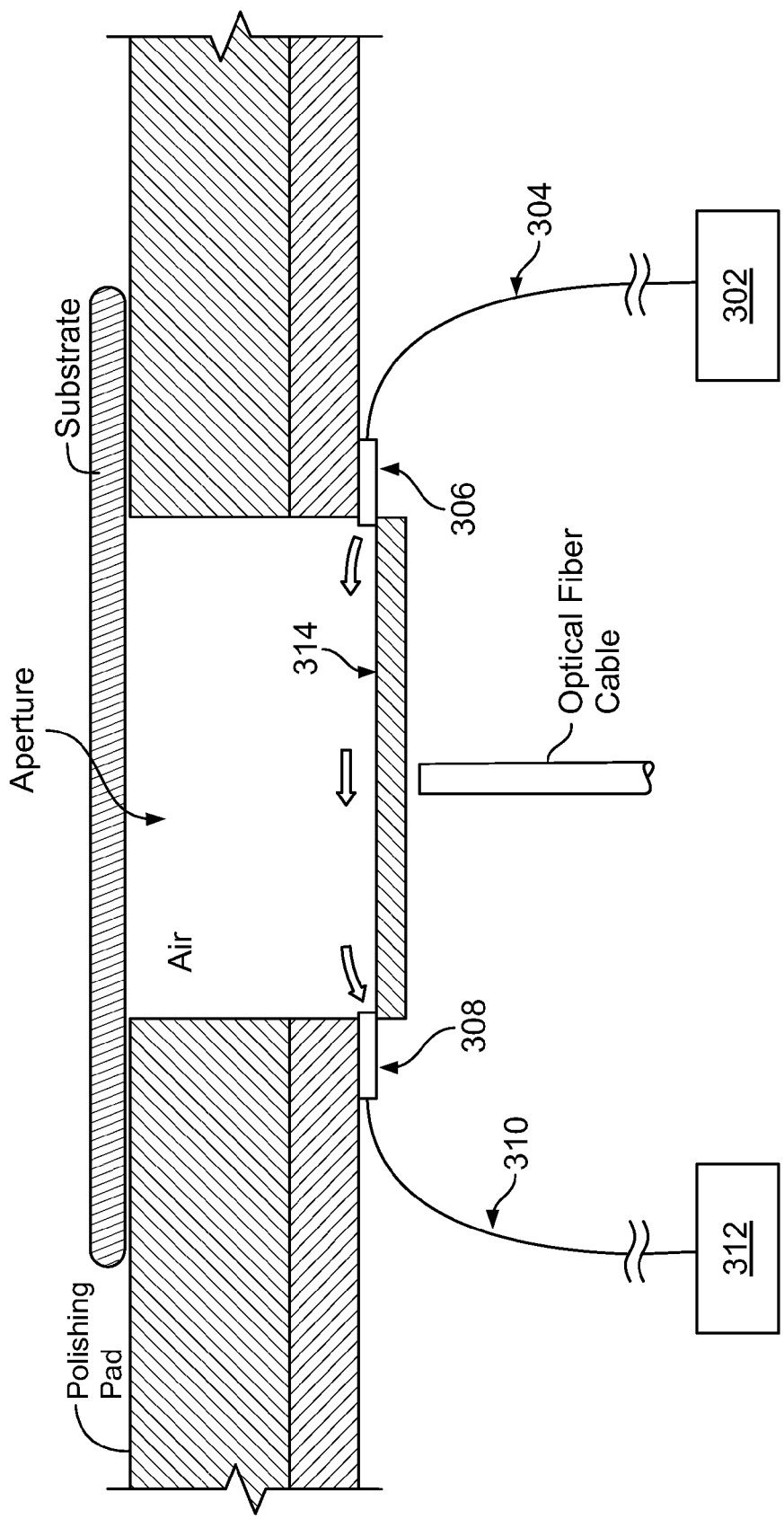
FIG. 3 shows an implementation of a flushing system.

FIG. 3 shows an implementation of the laminar-flow flushing system. The flushing system includes a gas source 302, a delivery line 304, a delivery nozzle 306, a suction nozzle 308, a vacuum line 310, and a vacuum source 312. The gas source 302 and vacuum source can be configured so that they can introduce and suction a same or a similar volume of gas. The delivery nozzle 306 is situated so that the laminar flow of gas is directed across the transparent top surface 314 of the in-situ monitoring module and not directed at the substrate surface being polished. Consequently, the laminar flow of gas does not dry out slurry on a substrate surface being polished, which can undesirably affect polishing.

Figure 4:
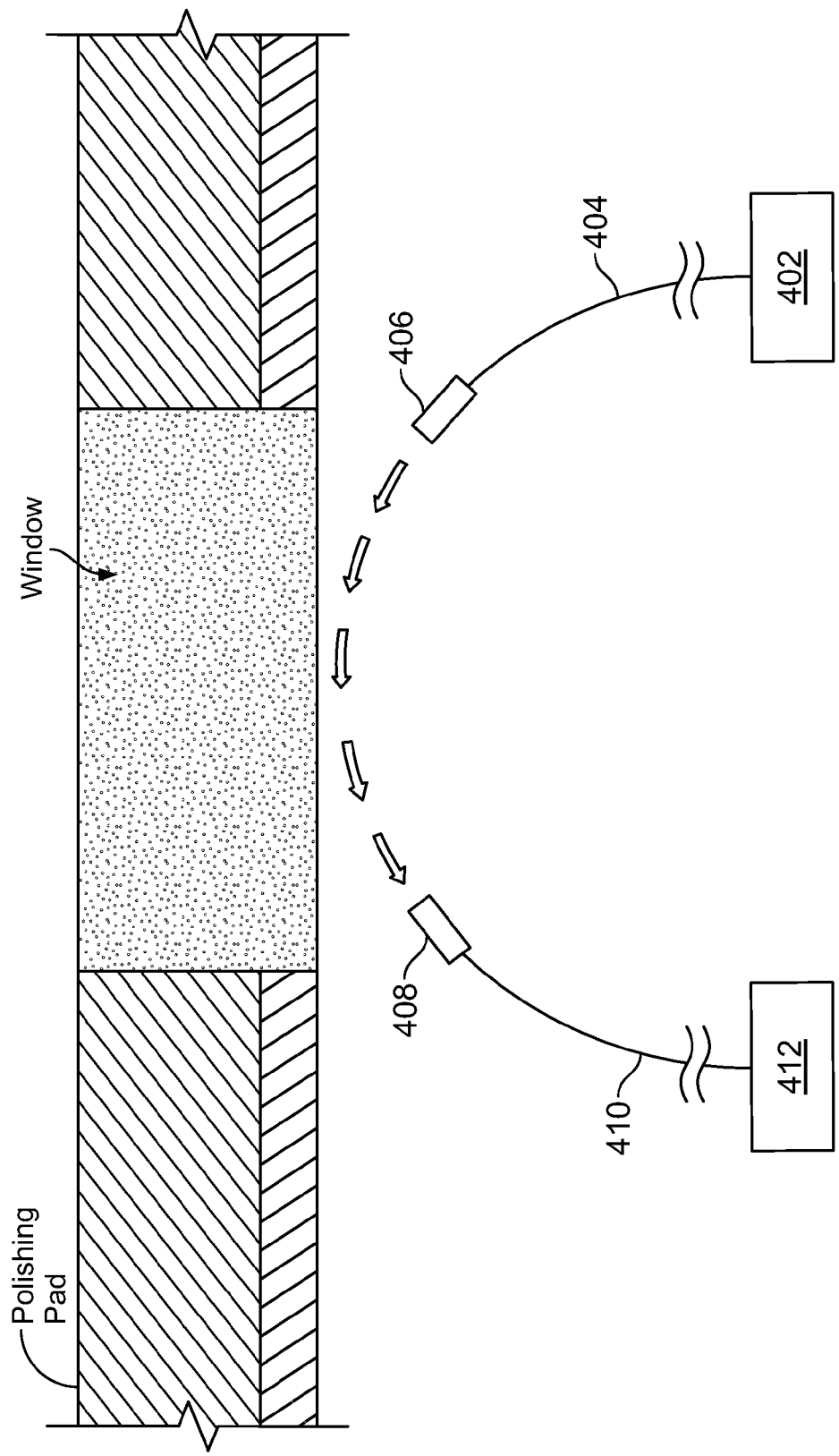
FIG. 4 shows an alternative implementation of the flushing system.

FIG. 4 shows an implementation of the flushing system for preventing the formation of condensation on a bottom surface of the solid window. The system reduces or prevents the formation of condensation at the bottom surface of the polishing pad window. The system includes a gas source 402, a delivery line 404, a delivery nozzle 406, a suction nozzle 408, a vacuum line 410, and a vacuum source 412. The gas source 402 and vacuum source can be configured so that they can introduce and suction a same or a similar volume of gas. The delivery nozzle 406 is situated so that the flow of gas is directed at the bottom surface window in the polishing pad 30.

In one implementation that is an alternative to the implementation of FIG. 4, the flushing system does not include a vacuum source or line. In lieu of these components, the flushing system includes a vent formed in the platen so that the gas introduced into the space underneath the solid window can be exhausted to a side of the platen or, alternatively, to any other location in the polishing apparatus that can tolerate moisture.

The above-described gas source and vacuum source can be located away from the platen so that they do not rotate with the platen. In this case, a rotational coupler for conveying gas is included for each of the supply line and the vacuum line.

Returning to FIG. 1, the polishing apparatus 20 includes a combined slurry/rinse arm 39. During polishing, the arm 39 is operable to dispense slurry 38 containing a liquid and a pH adjuster. Alternative, the polishing apparatus includes a slurry port operable to dispense slurry onto polishing pad 30.

The polishing apparatus 20 includes a carrier head 70 operable to hold the substrate 10 against the polishing pad 30. The carrier head 70 is suspended from a support structure 72, for example, a carousel, and is connected by a carrier drive shaft 74 to a carrier head rotation motor 76 so that the carrier head can rotate about an axis 71. In addition, the carrier head 70 can oscillate laterally in a radial slot formed in the support structure 72. In operation, the platen is rotated about its central axis 25, and the carrier head is rotated about its central axis 71 and translated laterally across the top surface of the polishing pad.

The polishing apparatus also includes an optical monitoring system, which can be used to determine a polishing endpoint as discussed below. The optical monitoring system includes a light source 51 and a light detector 52. Light passes from the light source 51, through the optical access 36 in the polishing pad 30, impinges and is reflected from the substrate 10 back through the optical access 36, and travels to the light detector 52.

A bifurcated optical cable 54 can be used to transmit the light from the light source 51 to the optical access 36 and back from the optical access 36 to the light detector 52. The bifurcated optical cable 54 can include a "trunk" 55 and two "branches" 56 and 58.

As mentioned above, the platen 24 includes the recess 26, in which the optical head 53 is situated. The optical head 53 holds one end of the trunk 55 of the bifurcated fiber cable 54, which is configured to convey light to and from a substrate surface being polished. The optical head 53 can include one or more lenses or a window overlying the end of the bifurcated fiber cable 54 (e.g., as shown in FIG. 3). Alternatively, the optical head 53 can merely hold the end of the trunk 55 adjacent the solid window in the polishing pad. The optical head 53 can hold the above-described nozzles of the flushing system. The optical head 53 can be removed from the recess 26 as required, for example, to effect preventive or corrective maintenance.

The platen includes a removable in-situ monitoring module 50. The in-situ monitoring module 50 can include one or more of the following: the light source 51, the light detector 52, and circuitry for sending and receiving signals to and from the light source 51 and light detector 52. For example, the output of the detector 52 can be a digital electronic signal that passes through a rotary coupler, e.g., a slip ring, in the drive shaft 22 to the controller for the optical monitoring system. Similarly, the light source can be turned on or off in response to control commands in digital electronic signals that pass from the controller through the rotary coupler to the module 50.

The in-situ monitoring module can also hold the respective ends of the branch portions 56 and 58 of the bifurcated optical fiber 54. The light source is operable to transmit light, which is conveyed through the branch 56 and out the end of the trunk 55 located in the optical head 53, and which impinges on a substrate being polished. Light reflected from the substrate is received at the end of the trunk 55 located in the optical head 53 and conveyed through the branch 58 to the light detector 52.

In one implementation, the bifurcated fiber cable 54 is a bundle of optical fibers. The bundle includes a first group of optical fibers and a second group of optical fibers. An optical fiber in the first group is connected to convey light from the light source 51 to a substrate surface being polished. An optical fiber in the second group is connected to received light reflecting from the substrate surface being polished and convey the received light to a light detector. The optical fibers can be arranged so that the optical fibers in the second group form an X-like shape that is centered on the longitudinal axis of the bifurcated optical fiber 54 (as viewed in a cross section of the bifurcated fiber cable 54). Alternatively, other arrangements can be implemented. For example, the optical fibers in the second group can form V-like shapes that are mirror images of each other. A suitable bifurcated optical fiber is available from Verity Instruments, Inc. of Carrollton, Tex.

There is usually an optimal distance between the polishing pad window and the end of the trunk 55 of bifurcated fiber cable 54 proximate to the polishing pad window. The distance can be empirically determined and is affected by, for example, the reflectivity of the window, the shape of the light beam emitted from the bifurcated fiber cable, and the distance to the substrate being monitored. In one implementation, the bifurcated fiber cable is situated so that the end proximate to the window is as close as possible to the bottom of the window without actually touching the window. With this implementation, the polishing apparatus 20 can include a mechanism, e.g., as part of the optical head 53, that is operable to adjust the distance between the end of the bifurcated fiber cable 54 and the bottom surface of the polishing pad window. Alternatively, the proximate end of the bifurcated fiber cable is embedded in the window.

The light source 51 is operable to emit white light. In one implementation, the white light emitted includes light having wavelengths of 200-800 nanometers. A suitable light source is a xenon lamp or a xenon-mercury lamp.

The light detector 52 can be a spectrometer. A spectrometer is basically an optical instrument for measuring properties of light, for example, intensity, over a portion of the electromagnetic spectrum. A suitable spectrometer is a grating spectrometer. Typical output for a spectrometer is the intensity of the light as a function of wavelength.

Optionally, the in-situ monitoring module 50 can include other sensor elements. The in-situ monitoring module 50 can include, for example, eddy current sensors, lasers, light emitting diodes, and photodetectors. With implementations in which the in-situ monitoring module 50 includes eddy current sensors, the module 50 is usually situated so that a substrate being polished is within working range of the eddy current sensors.

Figure 5:
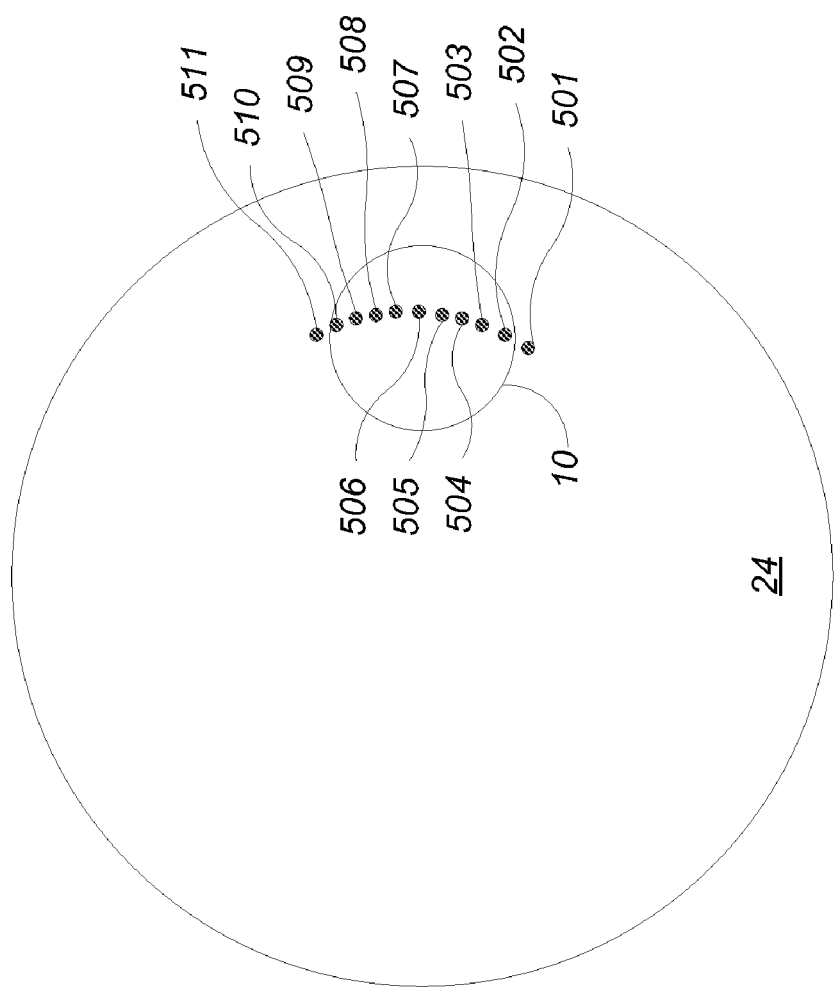
FIG. 5 is an overhead view of a polishing pad and shows locations where in-situ measurements are taken.

The light source 51 and light detector 52 are connected to a computing device operable to control their operation and to receive their signals. The computing device can include a microprocessor situated near the polishing apparatus, e.g., a personal computer. With respect to control, the computing device can, for example, synchronize activation of the light source 51 with the rotation of the platen 24. As shown in FIG. 5, the computer can cause the light source 51 to emit a series of flashes starting just before and ending just after the substrate 10 passes over the in-situ monitoring module. Each of points 501-511 represents a location where light from the in-situ monitoring module impinged upon and reflected off of the substrate 10. Alternatively, the computer can cause the light source 51 to emit light continuously starting just before and ending just after the substrate 10 passes over the in-situ monitoring module.

Figure 6A:
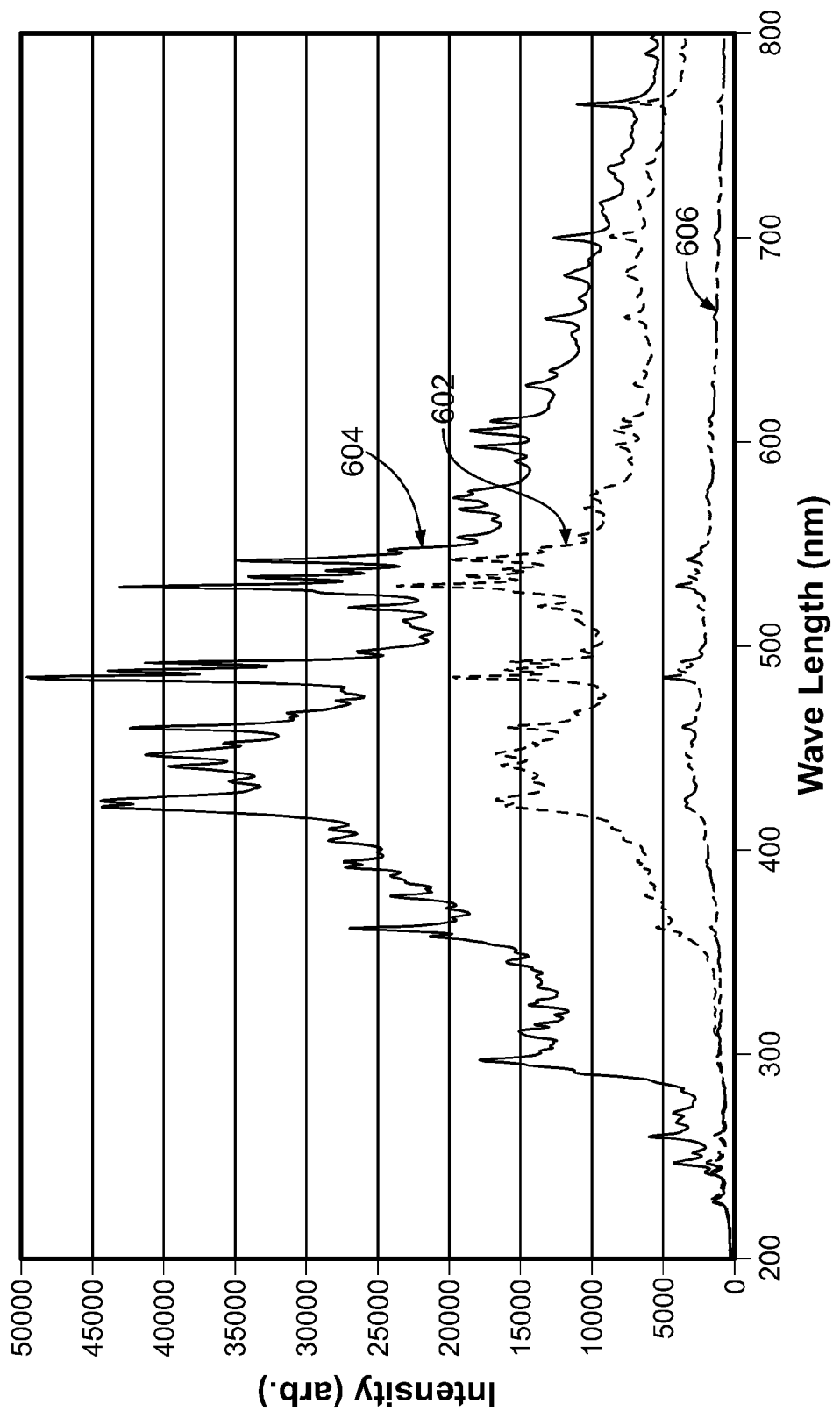
FIGS. 6A-D shows a plot of a spectrum obtained from in-situ measurements.

With respect to receiving signals, the computing device can receive, for example, a signal that carries information describing a spectrum of the light received by the light detector 52. FIG. 6A shows examples of a spectrum measured from light that is emitted from a single flash of the light source and that is reflected from the substrate. Spectrum 602 is measured from light reflected from a product substrate. Spectrum 604 is measured from light reflected from a base silicon substrate (which is a wafer that has only a silicon layer). Spectrum 606 is from light received by the optical head 53 when there is no substrate situated over the optical head 53. Under this condition, referred to in the present specification as a dark condition, the received light is typically ambient light.

Figure 6B:
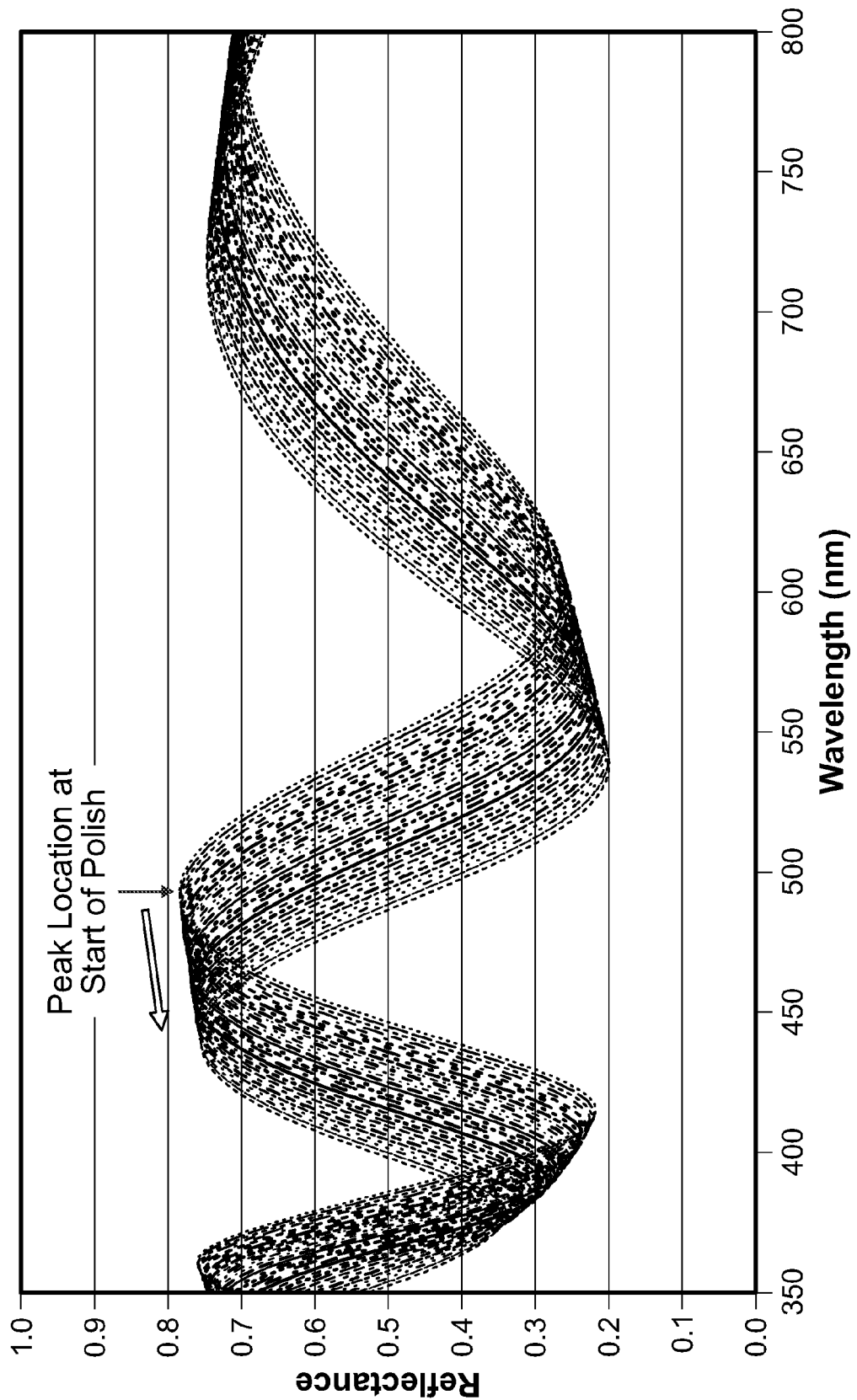
Figure 6C:
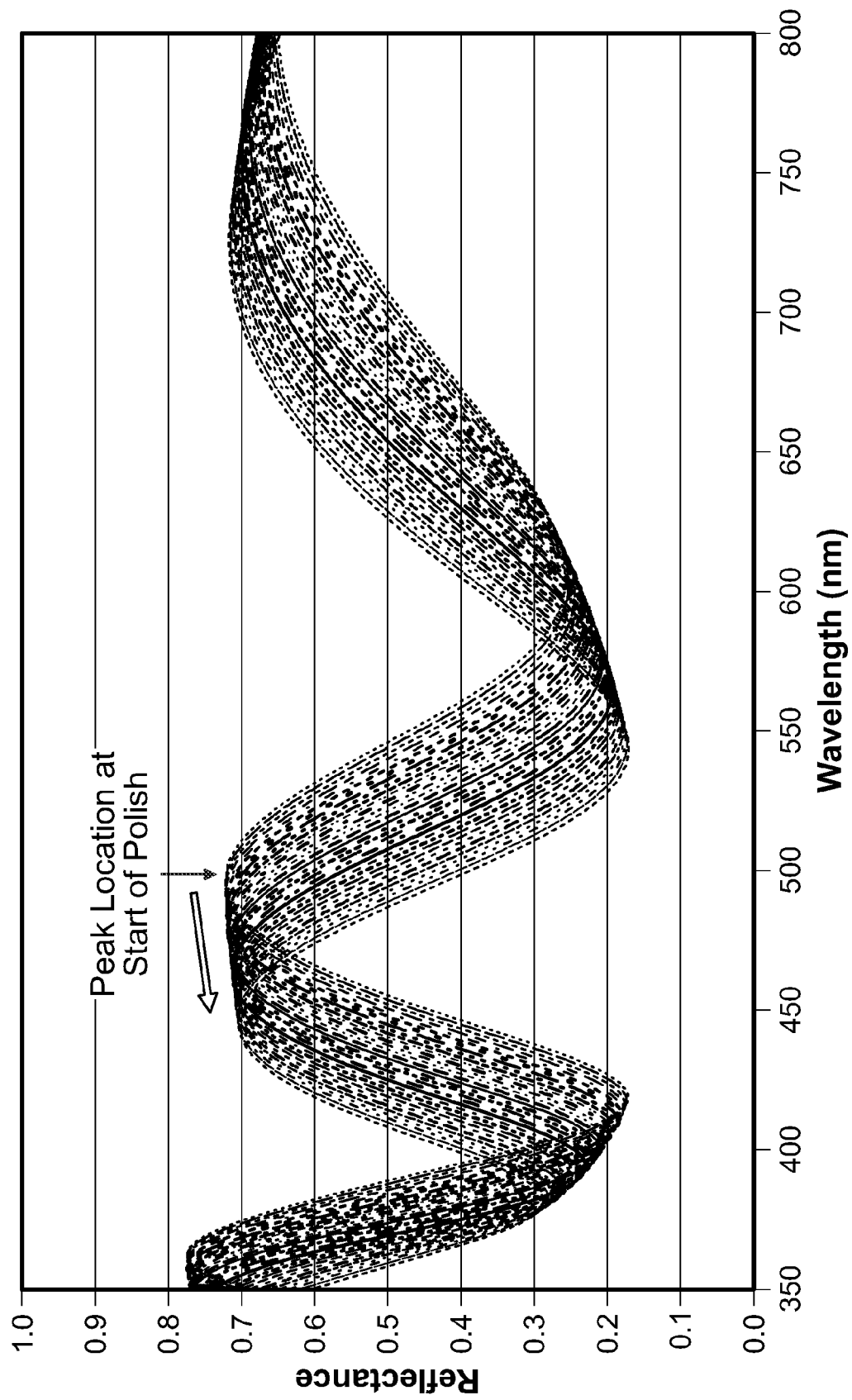
Figure 6D:
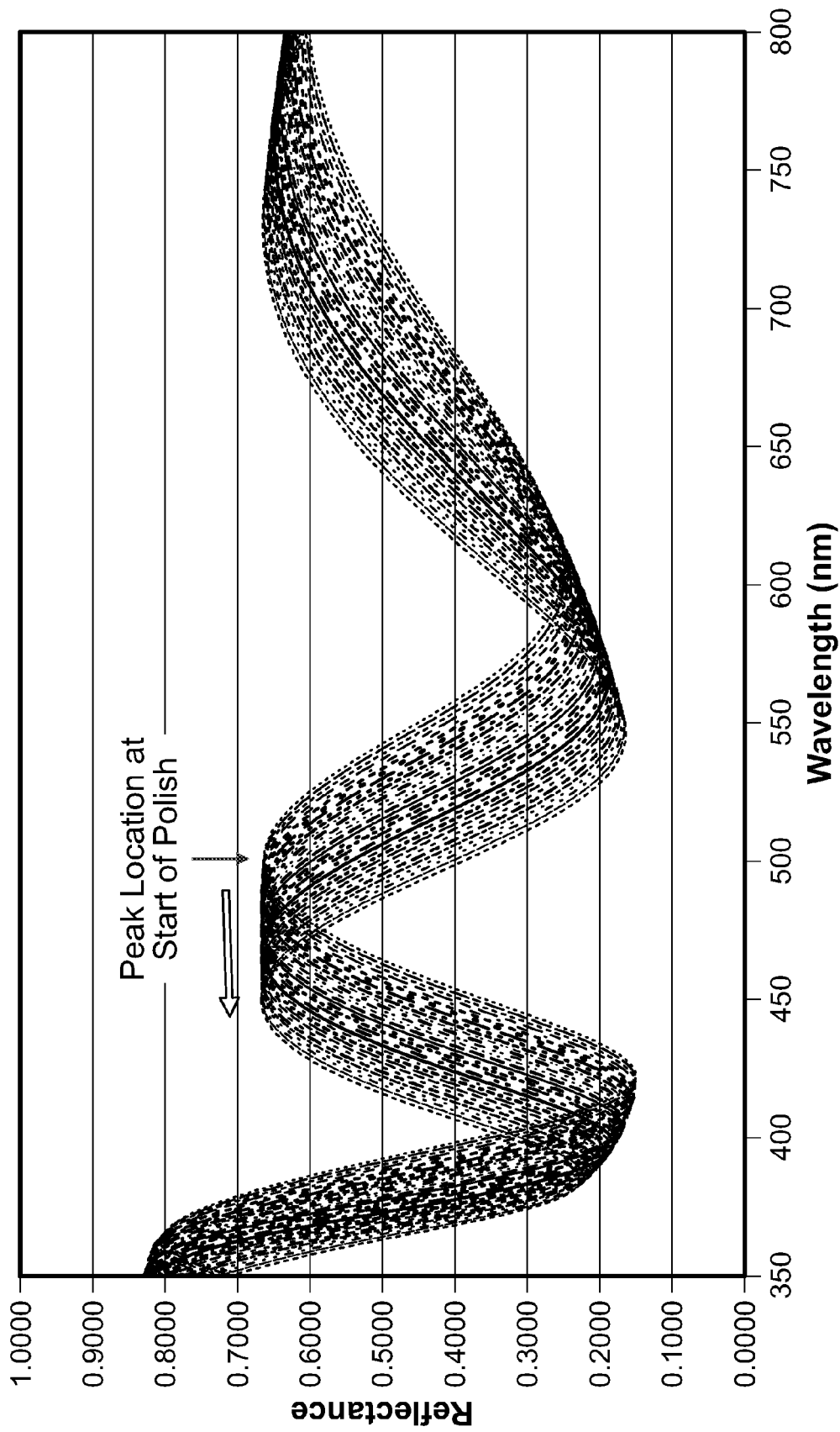

The computing device can process the above described signal, or a portion thereof, to determine an endpoint of a polishing step. Without being limited to any particular theory, the spectrum of light reflected from the substrate 10 evolves as polishing progresses. FIGS. 6B, 6C, and 6D provide examples of the evolution of the spectrum as polishing of a film of interest progresses for different shallow trench isolation (STI) processes. More specifically, both the location of a specific peak and a width associated with the specific peak change as the polishing progresses.

Figure 7:
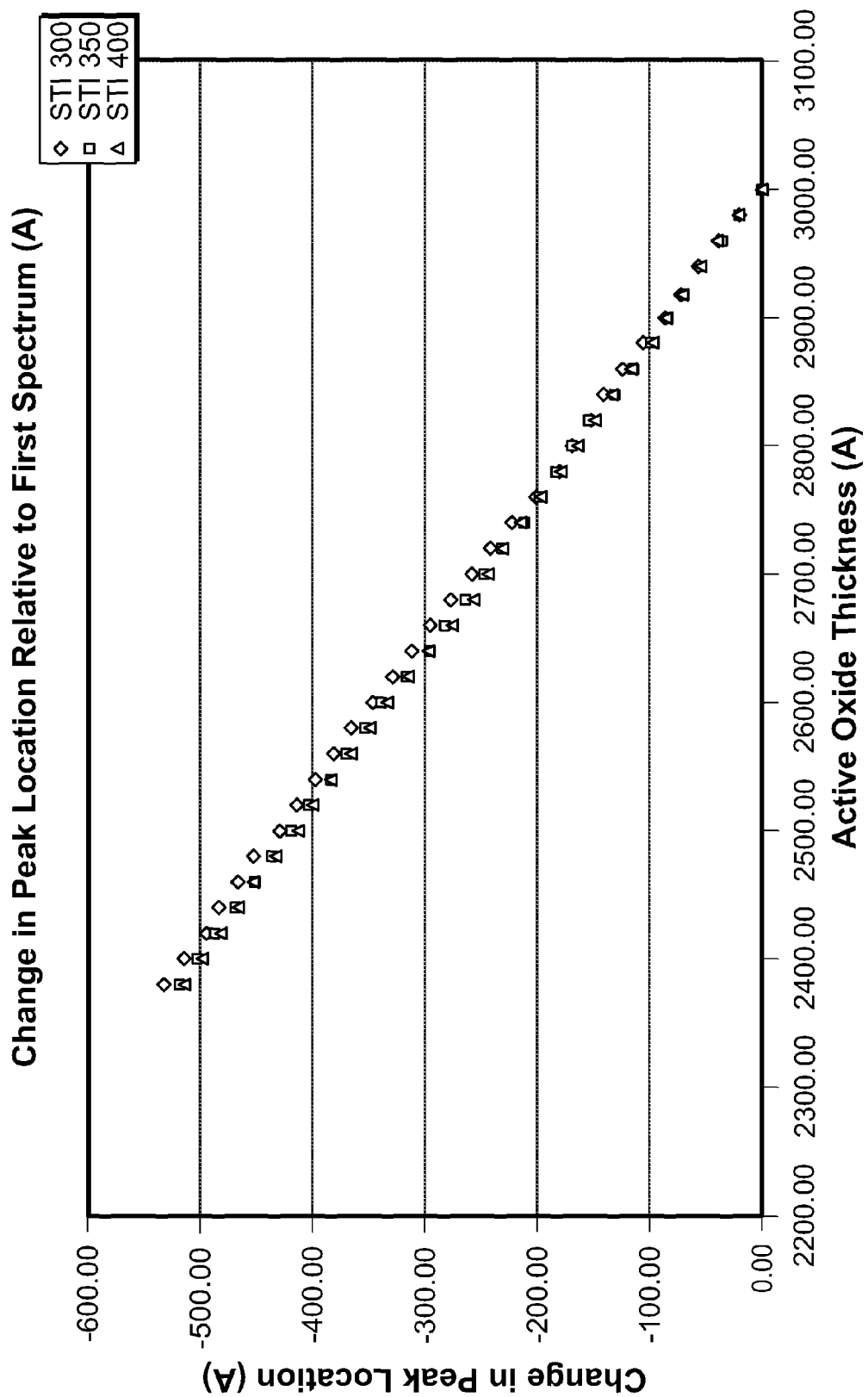
FIG. 7 shows a plot of the location of a selected peak in a spectrum vs. oxide thickness.

Results of the peak location as the polishing progresses are summarized in the plot in FIG. 7. Note that, for all the processes illustrated here, the location of the reflectance peak behaves about linearly with respect to, in this case, an active oxide thickness. Without being limited to any particular theory, it has been observed that the thickness of a film on the substrate being polished changes proportionally to the change in the active oxide thickness. In general, the peak location does not have to behave linearly with the thickness of the film on the substrate being polished, but only need to behave in a relatively simple and known way, e.g., as a polynomial or as a set of Bezier functions.

Such a simple behavior belies possibly massive efforts that can be required to compare the peak behavior of current spectra to those generated either theoretically or experimentally in a reference library, as is done in copending application U.S. Ser. No. 11/555,171. Rather, because the behavior of parameters associated with the reflectance peaks in a given process is simple, much of this effort can be bypassed by capturing the relationship between the parameters associated with the peak and a second parameter in a lookup table. The second parameter can represent, for example, the thickness of the film on the substrate being polished.

Such a lookup table is presented in FIG. 8. The lookup table is a list of parameter values. For example, a first parameter would be a change in peak location relative to an initial spectrum. A corresponding second parameter could then be the amount of polishing film removed. The lookup table would be used as follows: if the selected peak of a current spectrum is shifted by −247.00 Å, then the corresponding amount of polishing film removed would be 300.00 Å. Alternatively, if the selected peak of a current spectrum is shifted by −265.00 Å, then the corresponding amount of polishing film removed would be 320.00 Å.

A more likely scenario, however, if that a measured value of the first parameter is not exactly equal to a value of the first parameter in the lookup table. Assuming that the value of the first parameter lies in between the minimum and maximum value of the first parameter in the lookup table, then the corresponding value of the second parameter can be found through an interpolation scheme. The interpolation scheme depends on the assumed behavior of the second parameter with respect to the first parameter. For example, if the behavior is linear, then a linear interpolation would be performed. In that regard, if the selected peak of a current spectrum is shifted by −256.00 Å, then an assumption of linear behavior would produce a value of the corresponding amount of polishing film removed of 310.00 Å. A different assumed behavior would require a different interpolation scheme which could produce a different value of the corresponding amount of polishing film removed.

The lookup table may therefore be used to determine, at any given time, the amount of polishing film removed from a measured current reflectance spectrum. Such a method 900 to perform this determination is presented in FIG. 9. The method 900 comprises polishing a substrate 902. The polishing is done with a polishing apparatus operable to polish the substrate. The polishing apparatus includes a rotatable disk-shaped platen on which a polishing pad is situated.

As the substrate is being polished, a light from a light source 904 is generated. The light source is operable to emit white light. In one implementation, the white light emitted includes light having wavelengths of 200-800 nanometers. A suitable light source is a xenon lamp or a xenon mercury lamp.

The light is normally reflected 906 off the substrate onto the detector Because the light spans over a range of wavelengths, a reflectance spectrum is formed at the detector. That is, the reflectance of the light depends on the wavelength as, for example, noted in the plot in FIG. 6A. The reflectance spectrum can then be converted into an electrical signal by the detector.

The signal is analyzed and a reflectance peak selected 908. A peak from the spectrum, which can include a plurality of peaks over the wavelength range, is then selected. A first parameter in the form of a relative change in the wavelength and/or width of a peak (e.g., the width measured at a fixed distance below the peak or measured at a height halfway between the peak and the nearest valley), an absolute wavelength and/or width of the peak, or both can be used to determine the endpoint for polishing according to an empirical formula. The best peak (or peaks) to use when determining the endpoint varies depending on what materials are being polished and the pattern of those materials.

A method 908 for selecting a spectral peak to use when determining the endpoint for the polishing process is shown in FIG. 9. Properties of a substrate with the same pattern as the product substrate are measured (step 922). The substrate which is measured is referred to in the instant specification as a "set-up" substrate. The set-up substrate can simply be a substrate which is similar to or the same as the product substrate, or the set-up substrate can be one substrate from a batch of product substrates. The properties that are measured can include a pre polished thickness of a film of interest at a particular location of interest on the substrate. Typically, the thicknesses at multiple locations are measured. The locations are usually selected so that a same type of die feature is measured for each location. Measurement can be performed at a metrology station.

The set-up substrate is polished in accordance with a polishing step of interest and the spectra obtained during polishing are collected (step 924). Polishing and spectral collection can be performed at the above described polishing apparatus. The spectra are collected by the in situ monitoring system during polishing. The substrate is overpolished, i.e., polished past an estimated endpoint, so that the spectrum of the light that is reflected from the substrate when the target thickness is achieved can be obtained.

Properties of the overpolished substrate are measured (step 926). The properties include post polished thicknesses of the film of interest at the particular location or locations used for the pre polish measurement.

The measured thicknesses and the collected spectra are used to select, by examining the collected spectra, a particular peak to monitor during polishing (step 928). The peak can be selected by an operator of the polishing apparatus or the selection of the peak can be automated (e.g., based on conventional peak finding algorithms and an empirical peak selection formula). If a particular region of the spectrum is expected to contain a peak that is desirable to monitor during polishing (e.g., due to past experience or calculations of peak behavior based on theory), only peaks in that region need be considered. A peak typically is selected that exhibits a significant change in location or width during processing, particularly around the time that a target film thickness is achieved. For example, peaks in a spectrum typically change significantly in location and width when an oxide layer is polished away and an underlying nitride layer is exposed.

Once the peak has been selected, a second parameter is determined 910 from a value of the first parameter and the lookup table as described above. The first parameter can be a change in wavelength of the peak from an initial wavelength before polishing, and the second parameter can be the amount of polishing film removed.

In response to a value of the second parameter determined from the lookup table, the polishing may be changed 912. For example, there may be a critical thickness at which the polishing may need to be slowed or stopped.

The lookup table may be more specifically used for endpoint determination during polishing. A method 1000 for accomplishing such a determination is shown in FIG. 10. The method comprises the selecting 1008 a peak of the spectrum, generating 1040 a value of a first parameter associated with the selected peak, checking if the value of the first parameter associated with the selected peak of the spectrum crosses a threshold associated with the polishing endpoint 1060, and, if so, ceasing the polishing 1080.

Selecting 1008 a peak of the spectrum comprises measuring properties of a setup substrate 1022 (described above in 922), determining 1024 a polishing endpoint associated with a target value of a second parameter, collecting 1026 spectra from the setup substrate (described above in 924), measuring 1028 the polished setup substrate (described above in 926), and selecting 1030 a peak to monitor (described above in 928).

Determining 1024 a polishing endpoint—that is, a value of a first parameter associated with a target value of a second parameter—is performed using the lookup table as described above.

Generating 1040 a value of the first parameter associated with the selected peak comprises polishing 1042 the substrate (described above in 902), irradiating 1044 the substrate with light (described above in 904), generating 1046 the current spectrum from reflected light at a detector (described above in 906), and determining 1048 a value of the second parameter associated with the selected peak (described above in 908).

After the value of the first parameter is generated, it is then determined 1060 if this value crosses a threshold associated with the polishing endpoint. This determination can be done using a processor. The processor can be located within a controller, the controller comprising the detector. For example, if the second parameter is an amount of polishing film removed during polishing, and there is initially, say, 300.00 Å of polishing film, then the polishing endpoint is −247.00 Å. That is, when the value of the first parameter associated with the selected peak of the current spectrum crosses −247.00 Å, then the polishing ceases 1080. Otherwise, the polishing continues and further current spectra are generated 1040.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in an information carrier, e.g., in a machine readable storage device or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The above described polishing apparatus and methods can be applied in a variety of polishing systems. Either the polishing pad, or the carrier head, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims. For example, the actions recited in the claims can be performed in a different order and still achieve desirable results.

What is claimed is:

1. A method, comprising:
    measuring an initial spectrum of light reflected from a substrate before polishing of the substrate;
    identifying a selected peak in the initial spectrum and determining an initial wavelength or an initial width of the selected peak in the initial spectrum;
    polishing the substrate with a polishing pad;
    while the substrate is being polished
        irradiating the substrate with light from a light source to generate light reflected from the substrate;
        measuring, using a processor, a current spectrum of the light reflected from the surface of the substrate;
        identifying, using the processor, the selected peak in the current spectrum and determining a current wavelength or a current width of the selected peak in the current spectrum;
        determining, using the processor, a difference between the initial wavelength or initial width and the current wavelength or current width, respectively;
        determining, using the processor, a value of a parameter, which is associated with the difference from a lookup table; and
        changing, using a controller, the polishing of the substrate depending upon the value of the parameter.

2. The method of claim 1, wherein polishing the substrate comprises removing a quantity of a substance from a surface of the substrate, and the parameter is a thickness of the substance.

3. The method of claim 1, wherein the difference is a wavelength shift relative to the initial wavelength.

4. The method of claim 1, wherein the difference is a change of width of the selected peak with respect to the initial width.

5. The method of claim 1, wherein polishing the substrate is a step in a shallow trench isolation process.

6. The method of claim 1, wherein polishing the substrate is a step in an interlayer dielectric process.

7. The method of claim 1, wherein the substrate comprises an exposed oxide layer and polishing the substrate comprises polishing the exposed oxide layer.

8. A method, comprising:
    irradiating a substrate with a first beam of light from a light source;
    before polishing the substrate measuring, using a processor, an initial spectrum of the first beam of light reflected from the substrate;
    identifying a selected peak in the initial spectrum and determining an initial wavelength or an initial width of the selected peak in the initial spectrum;
    determining, using a processor, a polishing endpoint from a lookup table, wherein the lookup table includes values for a difference and a parameter, and the polishing endpoint is determined by:
        defining a target value of the parameter; and
        determining a first value associated in the lookup table with the target value of the parameter;
    polishing the substrate;
    while the substrate is being polished
        irradiating the substrate with a second beam of light;
        measuring, using a processor, a current spectrum of the second beam of light reflected from the surface of the substrate;
        identifying, using a processor, the selected peak in the current spectrum and determining a current wavelength or a current width of the selected peak in the current spectrum;
        determining, using the processor, a difference value, the difference value being a difference between the initial wavelength or initial width and the current wavelength or current width, respectively; and ceasing the polishing if the difference value is within a predetermined range of the first value.

9. The method of claim 8, wherein polishing the substrate comprises removing a quantity of a substance from a surface of the substrate, and the parameter is a thickness of the substance.

10. The method of claim 8, wherein the difference value is a wavelength shift relative to the initial wavelength.

11. The method of claim 8, wherein the difference value is a change of width of the selected peak with respect to the initial width.

12. The method of claim 8, wherein polishing the substrate is a step in a shallow trench isolation process.

13. The method of claim 8, wherein polishing the substrate is a step in an interlayer dielectric process.

14. A computer program product, tangibly embodied on a non-transitory machine readable storage device, comprising instructions to cause a polishing system to perform the operations of:
  identifying a selected peak in an initial spectrum of light reflected from a substrate, before polishing of the substrate, and determining an initial wavelength or an initial width of the selected peak in the initial spectrum;
  while the substrate is being polished
    measuring a current spectrum of the light reflected from the surface of the substrate;
    identifying the selected peak in the current spectrum and a determining a current wavelength or a current width of the selected peak in the current spectrum;
    determining a difference between the initial wavelength or initial width and the current wavelength or current width, respectively;
    determining a value of a parameter, which is associated with the difference from a lookup table; and
    changing the polishing of the substrate depending upon the value of the parameter.

15. The computer program product of claim 14, wherein polishing a substrate comprises removing a quantity of a substance from a surface of the substrate, and the parameter is a thickness of the substance.

16. The computer program product of claim 14, wherein the difference is a wavelength shift relative to the initial wavelength.

17. The computer program product of claim 14, wherein the difference is a change of width of the selected peak with respect to the width of the selected peak of the initial spectrum.

18. An apparatus comprising:
  a polishing pad configured to polish a substrate;
  a light source configured to irradiate the substrate with light;
  an in-situ optical monitoring system configured to obtain a spectrum of reflected light from the substrate;
  a computer-readable storage medium configured to store a lookup table comprising values of a difference and a parameter;
  a controller configured to change the polishing of the substrate based upon a value of the parameter; and
  a processor configured to receive an initial spectrum from the optical monitoring system before polishing of the substrate, determine an initial wavelength or an initial width of the selected peak in the initial spectrum, receive a current spectrum from the optical monitoring system during polishing of the substrate, identify the selected peak in the current spectrum, and determine a current wavelength or a current width of the selected peak in the current spectrum, determine the difference between the initial wavelength or initial width and the current wavelength or current width, respectively, and determine the value of the parameter, which is associated with the difference from the lookup table.

19. The apparatus of claim 18, wherein polishing a substrate comprises removing a quantity of a substance from a surface of the substrate, and the parameter is a thickness of the substance.

20. The apparatus of claim 18, wherein the difference is a wavelength shift relative to the initial wavelength.

21. The apparatus of claim 18, wherein the difference is a change of width of the selected peak with respect to the initial width.

* * * * *